(12) United States Patent
Schindler et al.

(10) Patent No.: US 11,444,438 B2
(45) Date of Patent: Sep. 13, 2022

(54) SWITCH CABINET FRAME STRUCTURE HAVING CLOSED BASE FRAME

(71) Applicant: RITTAL GMBH & CO. KG, Herborn (DE)

(72) Inventors: Timo Schindler, Gladenbach (DE); Wolfgang Reuter, Liebenscheid (DE); Thomas Klaner, Kirchhain (DE)

(73) Assignee: RITTAL GMBH & CO. KG, Herborn (DE)

( * ) Notice: Subject to any disclaimer, the term of this patent is extended or adjusted under 35 U.S.C. 154(b) by 372 days.

(21) Appl. No.: 16/622,577

(22) PCT Filed: Apr. 19, 2018

(86) PCT No.: PCT/DE2018/100376
§ 371 (c)(1),
(2) Date: Dec. 13, 2019

(87) PCT Pub. No.: WO2019/001611
PCT Pub. Date: Jan. 3, 2019

(65) Prior Publication Data
US 2021/0151960 A1    May 20, 2021

(30) Foreign Application Priority Data

Jun. 28, 2017   (DE) .................. 10 2017 114 385.8

(51) Int. Cl.
*H02B 1/30* (2006.01)
*H02B 1/28* (2006.01)
(Continued)

(52) U.S. Cl.
CPC ............. *H02B 1/303* (2013.01); *H02B 1/012* (2013.01); *H02B 1/28* (2013.01); *H05K 7/183* (2013.01); *H02B 1/013* (2013.01)

(58) Field of Classification Search
CPC .. H05K 5/00; A47B 47/0058; A47B 47/0083; A47B 47/021; A47B 91/005
See application file for complete search history.

(56) References Cited

U.S. PATENT DOCUMENTS 5,292,189 A * 3/1994 Lau .................... H02B 1/301
                                                          312/334.6
6,164,460 A * 12/2000 Reuter .................. H02B 1/01
                                                          361/825
(Continued)

FOREIGN PATENT DOCUMENTS

CH          673913 A5   4/1990
DE         3816516 A1  11/1989
(Continued)

OTHER PUBLICATIONS

International Search Report (in English and German) and Written Opinion (in German) issued in PCT/DE2018/100376, dated Jul. 3, 2018; ISA/EP.

*Primary Examiner* — Robert J Hoffberg
(74) *Attorney, Agent, or Firm* — Harness, Dickey & Pierce, P.L.C.

(57) ABSTRACT

A switch cabinet frame rack with multiple profile struts and a rectangular base frame, the underside of which is an outer side of the switch cabinet frame rack, which has at least one through-opening, wherein the through-opening is closed by a skid which is detachable mounted on the outer side.

20 Claims, 9 Drawing Sheets

(51) Int. Cl.
*H05K 7/18* (2006.01)
*H02B 1/01* (2006.01)

(56) References Cited

U.S. PATENT DOCUMENTS

| | | | |
|---|---|---|---|
| 6,359,217 | B1 | 3/2002 | Thompson et al. |
| 9,078,340 | B2 * | 7/2015 | Cagliani ............ H02B 1/303 |
| 9,871,353 | B2 | 1/2018 | Boehme et al. |
| 9,991,684 | B2 | 6/2018 | Brueck et al. |
| 10,024,348 | B2 | 7/2018 | Schindler |
| 10,277,014 | B2 | 4/2019 | Brueck et al. |
| 10,396,531 | B2 * | 8/2019 | Reuter ............... H02B 1/013 |
| 10,617,203 | B2 * | 4/2020 | Tao .................. A47B 47/027 |
| 10,702,059 | B2 * | 7/2020 | Goelst .............. A47B 47/0091 |
| 10,925,390 | B2 * | 2/2021 | Reuter ............. A47B 47/0008 |
| 11,266,036 | B2 * | 3/2022 | Klaner .............. H02B 1/301 |
| 2007/0175648 | A1 * | 8/2007 | Francisquini ........ H02B 1/01 174/50 |
| 2011/0095157 | A1 | 4/2011 | Krieg |
| 2016/0352080 | A1 | 12/2016 | Brueck et al. |
| 2016/0352082 | A1 | 12/2016 | Boehme et al. |
| 2016/0352083 | A1 | 12/2016 | Brueck et al. |
| 2016/0363150 | A1 | 12/2016 | Schindler |
| 2018/0375302 | A1 | 12/2018 | Reuter et al. |
| 2019/0157847 | A1 | 5/2019 | Reuter |
| 2019/0214798 | A1 | 7/2019 | Schindler et al. |
| 2019/0252866 | A1 | 8/2019 | Reuter et al. |
| 2019/0257125 | A1 | 8/2019 | Bloh et al. |

FOREIGN PATENT DOCUMENTS

| | | | |
|---|---|---|---|
| DE | 4103678 C1 * | 3/1992 | ........... A47B 91/005 |
| DE | 19615759 A1 * | 10/1997 | ............... H02B 1/30 |
| DE | 102015121193 A1 | 6/2017 | |
| EP | 0818070 B1 | 11/1998 | |
| EP | 2843781 A1 * | 3/2015 | ............... E05C 9/02 |

* cited by examiner

SWITCH CABINET FRAME STRUCTURE HAVING CLOSED BASE FRAME

CROSS-REFERENCE TO RELATED APPLICATIONS

This application is a 371 U.S. National Phase of International Application No. PCT/DE2018/100376, filed on Apr. 19, 2018, which claims the benefit of German Application No. 10 2017 114 385.8, filed on Jun. 28, 2017. The entire disclosures of the above applications are incorporated herein by reference.

BACKGROUND

This section provides background information related to the present disclosure which is not necessarily prior art.

Technical Field

The invention relates to a switch cabinet frame rack with multiple profile struts and a rectangular base frame, the underside of which is an outer side of the switch cabinet frame rack, which has at least one through-opening. Such a switch cabinet frame rack is known from DE 10 2015 121 193 A1.

Discussion

For switch cabinet frame racks, it is generally desirable to form the underside of the base frame, via which the switch cabinet frame rack stands on a base, as a continuously closed profile side of the base frame in order to prevent moisture from entering the switch cabinet frame rack and thus potentially also the switch cabinet formed using the switch cabinet frame rack, so that a correspondingly high IP protection class is achieved.

On the other hand, however, through-openings are often provided at least in the corner area of the base frame through the underside of the base frame, for example to screw the switch cabinet frame rack to a switch cabinet base via the base frame. In order to eliminate the aforementioned disadvantages of such through-openings in the base frame, remaining through-openings in the base frame are closed with plugs or the like after screwing the base frame to the switch cabinet base. This is not only comparatively time-consuming and often overlooked, but there is also always the danger that the plugs or other sealing means will subsequently come loose again from the through-openings and moisture and other impurities can thus enter the switch cabinet.

SUMMARY

This section provides a general summary of the disclosure, and is not a comprehensive disclosure of its full scope or all of its features.

It is therefore the aspect of the invention, to further improve a switch cabinet frame rack as described above in such a way that it is protected against entering of moisture via the underside of the base frame of the switch cabinet frame rack.

Accordingly, it is provided that the through-opening is closed by a skid which is detachable mounted on the outer side. The skid can, for example, be a moulded plastic part that is locked in place with an integrally formed fastener or press-fittingly fixed in the through-opening. The skid can have a sliding surface on a side facing away from the outer side of the base frame, which facilitates moving the switch cabinet frame rack. The skid can have a sealing surface and/or a sealing element on a side facing the outer side of the base frame. The sealing surface or the sealing element can lie against the outer side in a fluidically sealing manner circumferentially closed around the through-opening.

The skid also has the advantage that the base frame is protected from paint abrasion if the switch cabinet frame rack is dragged over the floor, for example when the switch cabinet is mounted. The skid can also have a centering function, which facilitates the installation of the switch cabinet frame rack on a switch cabinet base, for example in that the switch cabinet base has a recess corresponding to the skid, in which the skid can be positively accommodated.

Accordingly, the outer side may have a contact surface via which the switch cabinet frame rack is placed on a switch cabinet base. The skid can be raised above the contact surface, and the switch cabinet base, in particular a cover side of a base corner piece of the switch cabinet base, can have a recess in which the skid is accommodated. The skid can be positively accommodated in the recess at least in the plane of the contact surface.

In order to further increase the sealing function of the skid, it can be provided that the skid has at least one seal enclosing the at least one through-opening, via which the skid lies against the underside of the base frame in a fluidically sealing manner.

The skid can have a fastening element, preferably a clamp connector or a clip connector, which engages in the base frame via the through-opening and is fixed in the through-opening. If, depending on the application, it should be necessary to remove the skid after the switch cabinet frame rack with the skid has been screwed to a switch cabinet base, the fastening element may be integrally formed on the skid via a predetermined breaking point.

The rectangular base frame of the switch cabinet frame rack may have the through-opening, which is closed by the skid, in at least one of its four corners, for example in a corner piece of the base frame. Preferably, however, the rectangular base frame has at least one through-opening in each of its four corners to screw the switch cabinet frame rack, for example, to a switch cabinet base, so that it can also be provided accordingly that the base frame has a skid in each of its four corners which closes the respective through-opening or through-openings.

The skid can also be provided for fixing a packaging of the switch cabinet frame rack to the switch cabinet frame rack, in particular to the outer side of the base frame of the switch cabinet frame rack, or for protecting the packaging of the switch cabinet frame rack from excessive friction, respectively. Accordingly, a packaging of the switch cabinet frame rack, for example a cardboard box, can be arranged between the skid and the underside of the base frame, wherein the skid with a fastening element extends through the packaging into the through-opening to be closed.

The skid may have a fitting piece with which the skid engages in a cut-out of the packaging, preferably in a positive-fitting manner. In particular, but not necessarily, the fitting piece can be formed on the fastening element.

The skid may have a support flange formed on its outer circumference and on the fitting piece, which support flange is spaced apart from the underside of the base frame by a thickness of the packaging. Thus the packaging can be fixed on the one hand by means of the positive fit and on the other hand by means of the support flange using the skid on the underside of the base frame.

The support flange can have an outer contour which is matched form-fittingly to an inner contour of a recess in the cover side of the switch cabinet base, in particular in the cover side of a base corner piece. Thereby the skid can have a centering function with respect to the switch cabinet base, which facilitates the mounting of the switch cabinet frame rack on the switch cabinet base, for example by aligning corresponding bolt passages.

In order to additionally provide a levelling function for the switch cabinet frame rack using the skid, the skid can have a threaded passage extending perpendicularly to the underside, preferably an injected threaded nut, into or through which a levelling bolt accessible from an upper side of the base frame opposite the underside is screwed.

The skid may have a bolt passage fluidically closed by a predetermined breaking point. In particular, if the skid has several bolt passages to enable different types of screwing of the switch cabinet frame rack to a switch cabinet base, it makes sense to close the various bolt passages via a predetermined breaking point, for example a plastic film or layer, in order to achieve the highest possible sealing.

Furthermore, the skid can have two lever pockets on its outer circumference, which are open to the outer circumference and to the underside of a base frame of a switch cabinet frame rack. Using a tool, such as a slotted screwdriver, the skid can be lifted from the underside via the lever pockets.

The switch cabinet frame rack can be placed with the base frame on a switch cabinet base, wherein the bolt passage, which is fluidically closed via a predetermined breaking point, is aligned with a second bolt passage of a base corner piece of the switch cabinet base and with a third bolt passage of the base frame. It can be provided that either the second or the third bolt passage has an internal thread, or that an internal thread, for example in the form of a welded nut, is assigned to them.

In each of its four corners, the switch cabinet base can have a base corner piece which has at least one further through-opening through its base side facing away from the base frame, which is closed by another skid which is detachably mounted on the base side from the outer side of the base corner piece. This embodiment facilitates centering in particular if several switch cabinet bases are to be stacked on top of each other in order to achieve a corresponding elevation of the switch cabinet frame rack.

The switch cabinet frame rack can thus be placed on a switch cabinet base which has at each of its four corners a base corner piece which is a shaped part, in particular a sheet metal shaped part, with a first and a second outer wall which extend perpendicular to each other and with an upper cover side and a lower base side which are arranged parallel to each other and perpendicular to the outer walls. The outer walls, the cover side and the base side may delimit an interior space of the base corner piece which is open towards a corner of the shaped part.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Further details of the invention are explained using the figures below. These show:

DETAILED DESCRIPTION

Example embodiments will now be described more fully with reference to the accompanying drawings.

Figure 1:
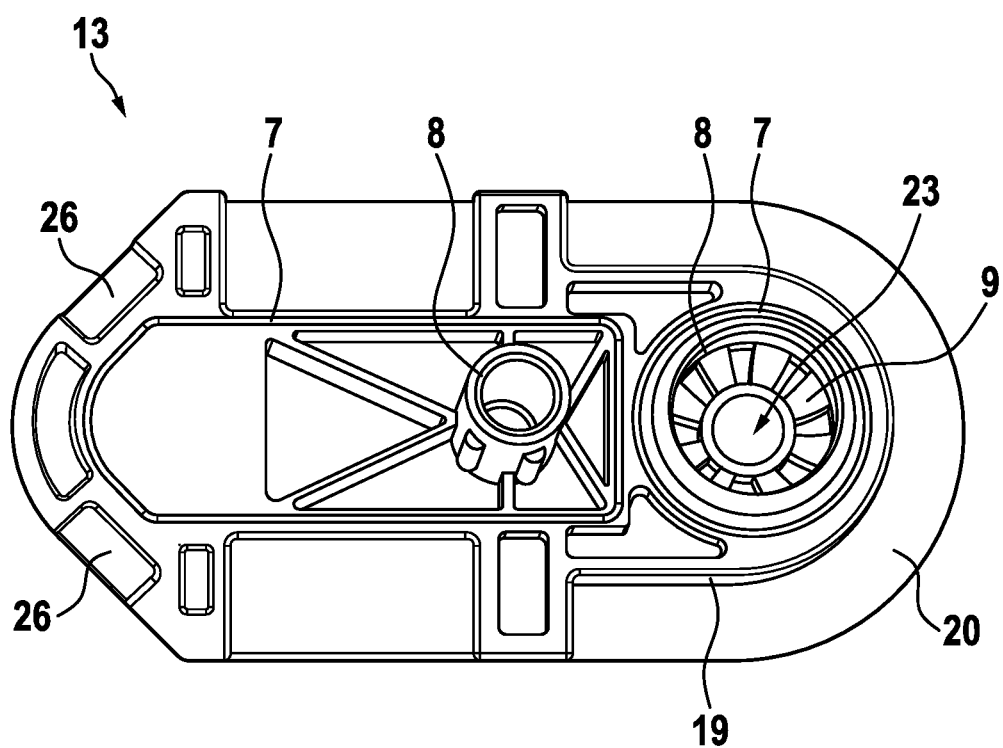
FIG. 1 shows a top view of the upper side of an embodiment of the sliding skid according to the invention.

FIG. 1 shows a top view of a first embodiment of a skid 13. The skid can be designed in particular as a plastic moulded part, for example as an injection moulded part. On the shown upper side, the skid 13 has two spaced apart fastening elements 8 with different diameters, with which the skid 13 can be attached facing the underside of a base frame of a switch cabinet frame rack to the base base frame. The fastening elements 8 are configured to be accommodated in a press fit or at least in a positive fit in each case in a through-opening in the underside of the base frame in order to fix the skid 13 to the underside of the base frame.

Furthermore, the skid 13 has two lever pockets 26 on its outer circumference, which are open to the outer circumference and to the underside of a base frame of a switch cabinet frame rack. Using a tool, such as a slotted screwdriver, the skid 13 can be lifted from the underside via the lever pockets.

To increase the sealing of the openings, the two fastening elements 8 are each surrounded by a circumferentially closed seal 7. If the skid 13 is attached to the underside of the base frame, the skid 13 abuts over the entire length of the two seals 7 so that the respective through-opening in which the fastening elements 8 are inserted is sealed against the environment of the switch cabinet frame rack. The sealing effect of the sealing elements 7 is further increased by the fact that the seals 7 are compressed by the weight of the frame rack itself.

One of the fastening elements 8 is designed as a bolt passage 23 which is closed by a predetermined breaking point 9 in the form of a thin plastic layer. If necessary, the predetermined breaking point 9 can be penetrated, for example for screwing the switch cabinet frame rack to a switch cabinet base.

Generally, only one fastening element 8 is required to fasten the skid 13 to the underside of a floor frame of a switch cabinet frame rack. The use of at least two fastening elements 8 has the advantage that, especially in the case of circularly symmetrical fastening elements 8, the skid is already precisely pre-positioned when it is mounted on the switch cabinet frame rack. However, it is conceivable that in particular the fastening element 8 designed as a bolt passage 23 has no fastening function or merely enters a corresponding through-opening in the underside of the base frame via a small projection in order to pre-position the skid 13 in relation to the base frame, while the holding function is provided by the additional fastening element 8.

The skid 13 also has a fitting piece 19 which is configured to penetrate with its outer contour into a corresponding cut-out 401 in a base cardboard box of the switch cabinet frame rack, while the cardboard box is overlapped by the support flange 20 surrounding the fitting piece 19 and is thus held on the underside of the bottom frame. In particular, at least one of the fastening elements 8 may be configured to extend through the packaging, in particular the base cardboard box, and into the through-opening in the underside of the base frame, where the fastening element is fixed to the base frame in the manner already described, for example by press fit, so that the base cardboard box is also held to the base frame.

Figure 6:
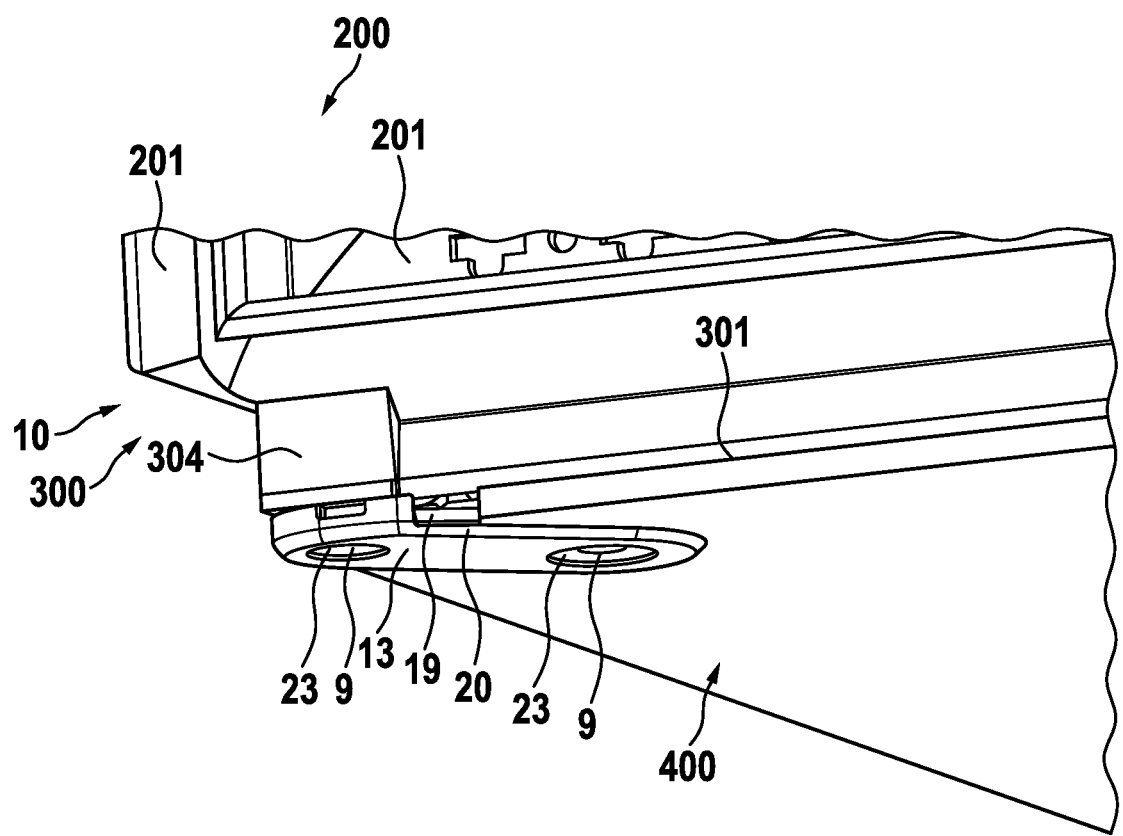
FIG. 6 shows a perspective view of the underside of a switch cabinet frame rack, on which a packaging is fixed using a skid.

This is shown in FIG. 6. Here it can be seen in particular that the support flange 20 has a distance to an upper contact side of the skid 13, via which the skid 13 lies against the underside 301 of the base frame 300 of the switch cabinet frame rack 200, which distance corresponds to the thickness of the cardboard box 400. The base frame 300 has a corner piece 304 with a vertical threaded hole through which the switch cabinet frame rack 200 can be screwed to a base corner piece. The skid 13 can remain mounted on the underside 301 of the base frame. In particular, the skid 13 has a bolt passage 23 which is aligned with the internal thread of the corner piece 304. Bolt passage 23 can in particular be closed by a predetermined breaking point 9.

A further bolt passage 23 closed by a predetermined breaking point 9 is arranged at a distance from the corner piece 304 in order to allow an alternative type of screwing of the base frame 300 to the switch cabinet base, in particular a base corner piece.

Figure 2:
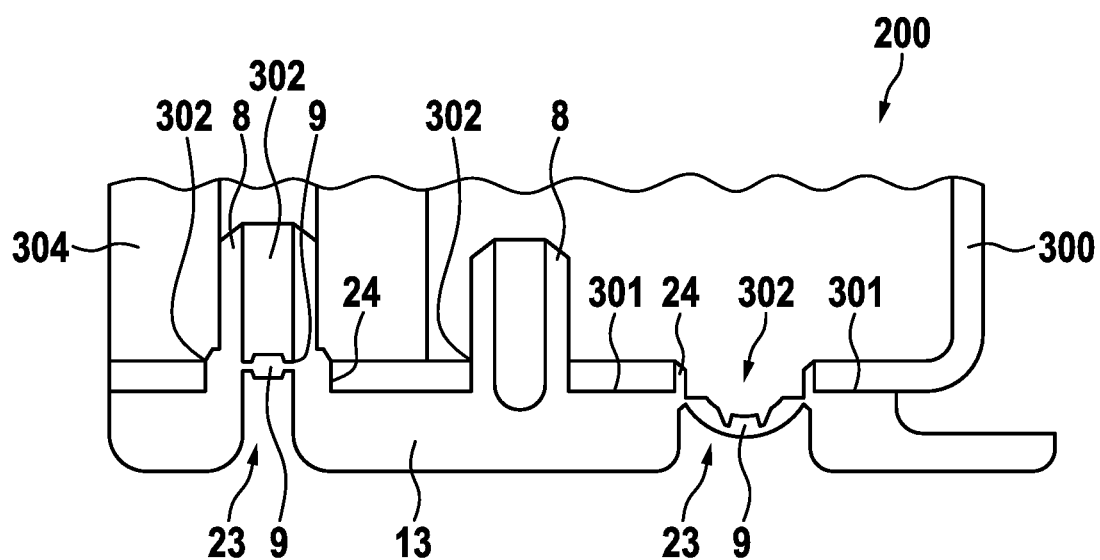
FIG. 2 shows a schematic cross-sectional view of another embodiment of a skid mounted on the underside of base frame according to the invention.

FIG. 2 shows a cross-sectional view of a skid 13 mounted on an underside 301 of a base frame 300 of a switch cabinet frame rack 200. The underside 301 has three through-openings 302 which are closed by the skid 13. When the skid 13 has bolt passages 23 aligned with the respective opening 302, these are closed with a predetermined breaking point 9 to ensure reliable sealing of the base frame 300 towards its underside 301 whenever the respective bolt passage 302 is not used for screwing the base frame, for example to a switch cabinet base.

In addition to the predetermined breaking point 9 closing the bolt passage 23, the bolt passage 23 shown on the left in FIG. 2 has a further predetermined breaking point 9 via which the fastening element 8 surrounding said bolt passage 23 is formed on the skid 13. This predetermined breaking point can help to subsequently remove the skid 13 from the underside 301 of the base frame 300. Preferably, the fastening element 8 shown on the right in the figure can also be formed on the skid 13 via a corresponding predetermined breaking point 9. The skid 13 is in this case formed in particular as an integrally formed injection moulded part, in particular as a plastic moulded part.

Figure 3:
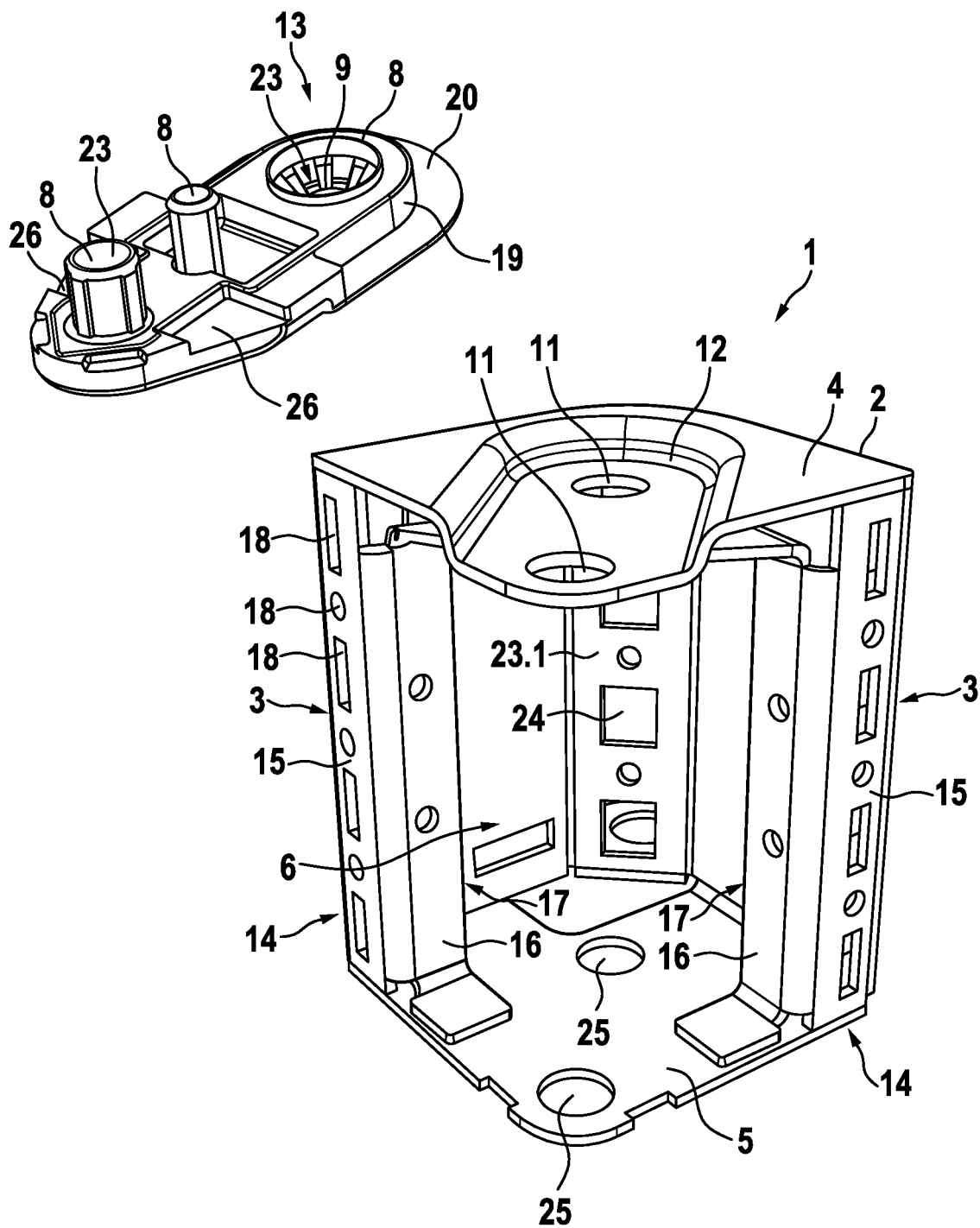
FIG. 3 shows a perspective view of another embodiment of a skid according to the invention and a corresponding base corner piece.

FIG. 3 illustrates a further functionality of an embodiment of the skid according to the invention. This functionality consists in the fact that the skid 13 can be used in conjunction with an appropriately shaped base frame to pre-align the switch cabinet frame rack via at least one skid 13 mounted on its underside with respect to the base frame. In particular, the support flange 20 on the outer circumference of the skid 13 may have an outer contour which corresponds to an inner contour of a recess 12 in the cover side 4 of the shown base corner piece 1. The pre-alignment thus achieved can be used, for example, to pre-align the two bolt passages 11 in the cover side 4 of the base corner piece 1 with respect to the bolt passage 23 and fastening element 8 front in the figure of the skid 13, so that one of the bolt passages 11 is aligned with the bolt passage 23 and the other bolt passage 11 is aligned with the fastening element 8, which has the further bolt passage 23.

The base corner piece 1 shown in FIG. 3 has a shaped part 2, which can in particular be designed as a sheet metal shaped part. The sheet metal shaped part 2 essentially consists of a cover side 4, a base side 5 and two outer walls 3, which extend perpendicularly to the cover side 4 and the base side 5 and connect them together at a distance. The outer walls 3 are connected by a connecting side 23.1 which extends at an angle of 45° to the outer walls 3. The outer walls 3 and the connecting side 23.1 are integrally formed and the connecting side 23.1 has a perforation of regularly spaced rectangular openings 24.

The cover side 4 has a trough-shaped recess 12, into which the skid 13 can be inserted in a form-fit manner. Due to the form-fitting contours of the skid 13 and the trough-shaped recess 12, an exact pre-positioning of the switch cabinet frame rack with respect to the base corner piece 1, in particular with respect to the cover side 4 of the formed sheet metal part 2, is achieved, so that a comfortable screwing of the sheet metal shaped part 2 and the switch cabinet frame rack is possible.

At the free ends facing away from the connecting side 23.1, the outer walls 3 each have an U-edging 14, with a first profile side 15 extending perpendicularly to the outer wall 3 and a second profile side 16 formed on the first profile side 15, which extends parallel to the outer wall 3 and has a free edge 17 arranged in the interior space 6, which is spaced apart from the outer wall 3. The first profile side 15 has a system perforation 18 of regularly spaced rectangular and round apertures. The second profile side 16 has further round holes, which can be used in particular for fixing base cover panels.

The sheet metal shaped part 2 can be obtained by punching, edging and welding a metal sheet, wherein the trough-shaped recess 12 can be formed, for example, in the course of an embossing process. The sheet metal shaped part 2 can thus be produced at low cost compared to injection-moulded corner pieces known from the state of the art.

In combination with FIGS. 2 and 3, FIGS. 4 and 5 show two possible ways of screwing the base frame 300 of a switch cabinet frame rack 200 to the base corner piece 1 of a switch cabinet base 100 as well as using a skid 13 located between the base frame 300 and the switch cabinet base 100. In the embodiment shown in FIG. 4, a screw bolt 500 is screwed to the base corner piece 1 of the switch cabinet base 100 via the upper side of the base frame 300 through a through-opening 302 of the base frame 300 and a bolt passage 24 in the skid 13. The base corner piece 1 can be formed corresponding to the embodiment shown in FIG. 3, wherein the rear bolt passage 11 shown in FIG. 3, which is closer to the connecting side 23.1, can have a threaded nut arranged on the underside of its cover side into which the screw bolt 500 can be screwed. In comparison, in the embodiment shown in FIG. 5, the screw bolt is screwed into an internal thread in the corner piece 304 of the base frame 300, starting from the cover side 4 and passing through the skid 13, wherein the bolt 500 passes through the front bolt passage 11 as shown in FIG. 3.

Figure 4:
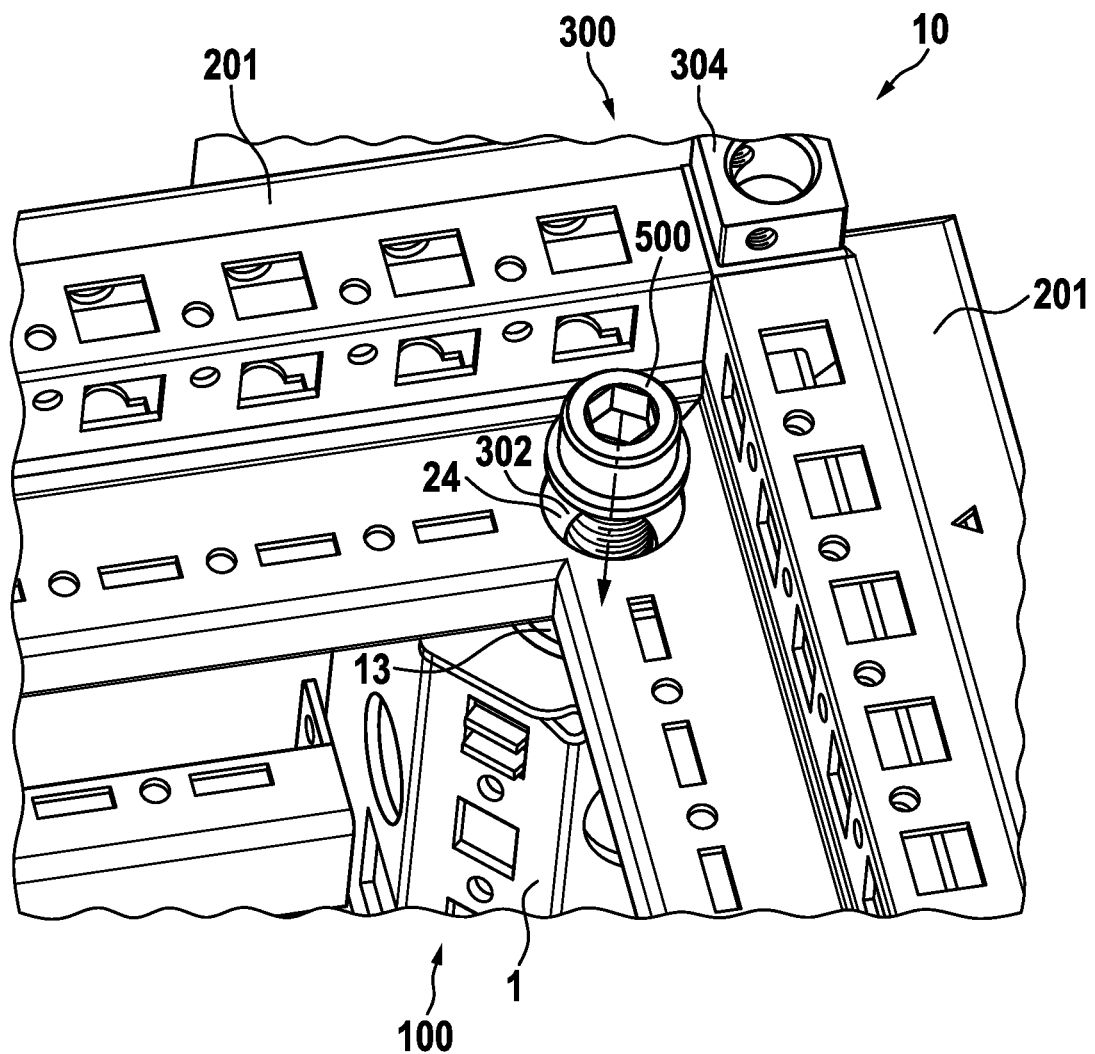
FIG. 4 shows a perspective view of a base frame which is screwed from its upper side to a switch cabinet base, according to an embodiment of the invention.
Figure 5:
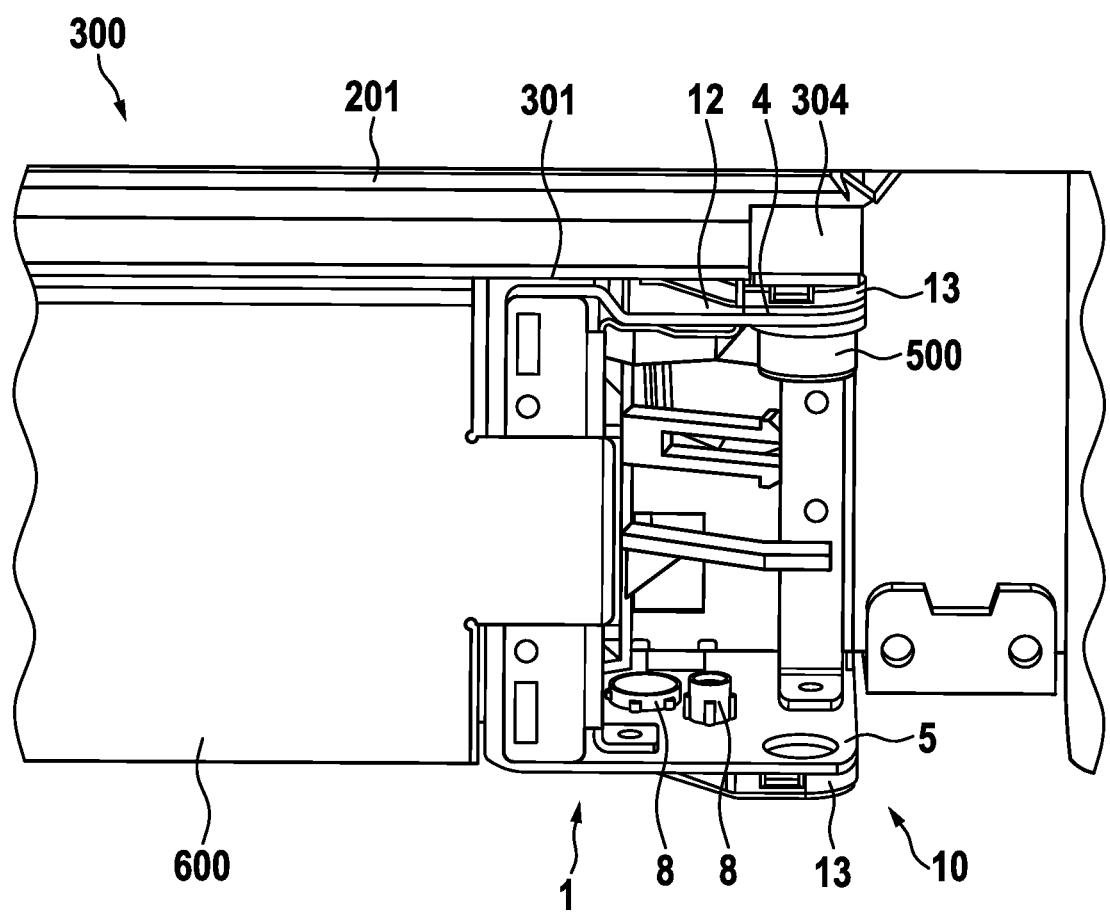
FIG. 5 shows a side view of a base frame, which is screwed to a base corner piece via its underside and a skid.
Figure 7:
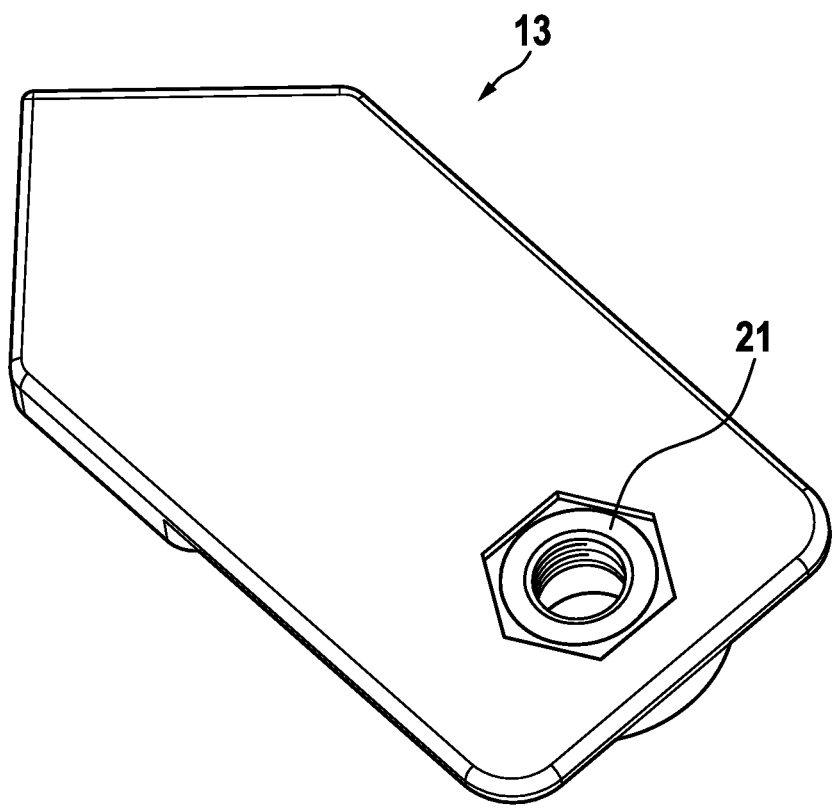
FIG. 7 shows a perspective view of the underside of another embodiment of a skid according to the invention.
Figure 8:
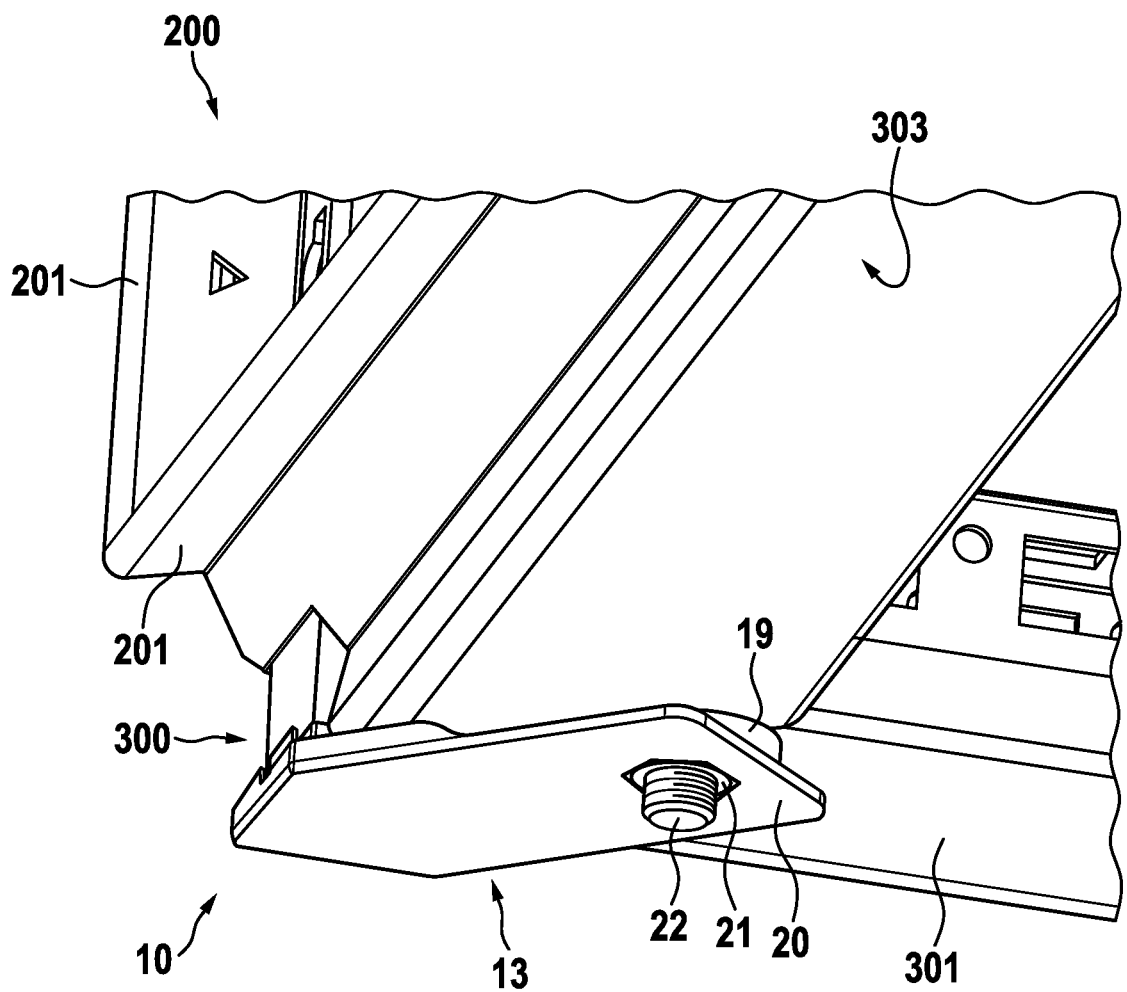
FIG. 8 shows the skid according to FIG. 7 in a position mounted on the underside of a base frame.
Figure 9:
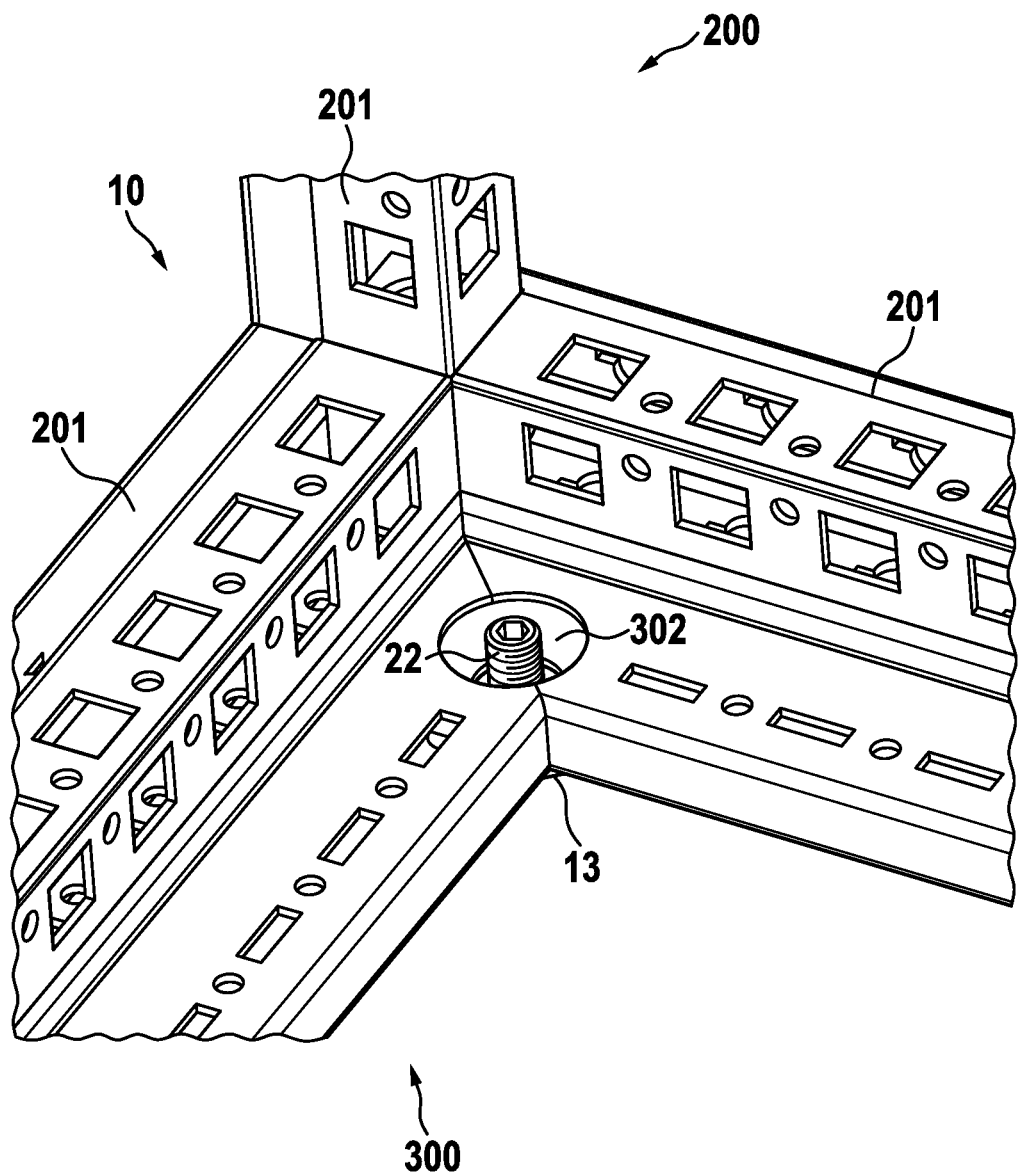
FIG. 9 shows a perspective view of the upper side of the arrangement according to FIG. 8.

Furthermore, the bolt 500 passes through the bolt passage 23 of the skid 13, which is surrounded by the fitting piece 19, in case of the embodiment according to FIG. 4, whereas the bolt 500 passes through the further bolt passage 23 of the skid 13 at the pointed end of the skid 13 in case of the embodiment according to FIG. 5. FIGS. 7 to 9 illustrate a further functionality of an embodiment of skid 13 according to the invention. This embodiment has a bolt passage perpendicular to its contact surface, which has a threaded passage 21, which may, for example, be in the form of a threaded nut injected into the skid in the form of a plastic injection moulded part. FIGS. 8 and 9 show that the skid 13 fixed to the contact surface 303 of the base frame 300 can be used to accommodate a levelling bolt 22 in the threaded passage 21, the levelling bolt being accessible from the upper side of the base frame via a through-opening 302 in the base frame 300 according to FIG. 9. The levelling bolt 22 has a drive at the end facing the upper side of the base frame 300, which drive is in the form of a hexagon socket. According to FIG. 8, the levelling bolt 22 protrudes from the skid 13 with one free end over the contact surface 303 and can be adjusted in the direction perpendicular to the contact surface 303 by turning so that a levelling function is provided.

The features of the invention disclosed in the above description, in the drawings and in the claims may be essential for the realisation of the invention, either individually or in any combination.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A switch cabinet frame rack comprising a switch cabinet frame and a switch cabinet base, wherein the switch cabinet frame comprises multiple profile struts and a rectangular base frame, an underside of the rectangular base frame is an outer side of the switch cabinet frame rack, the rectangular base frame has at least one first through-opening, wherein the at least one first through-opening is closed by a first skid which is detachable mounted on the outer side of the switch cabinet frame rack, wherein the outer side of the switch cabinet frame rack has a contact surface via which the switch cabinet frame rack is placed on the switch cabinet base, and wherein the first skid is raised relative to the contact surface, and the switch cabinet base has a recess in which the first skid is accommodated.

2. The switch cabinet frame rack according to claim 1, wherein the first skid is positively accommodated in the recess at least in a plane of the contact surface.

3. The switch cabinet frame rack according to claim 1, wherein the first skid has at least one seal enclosing the at least one first through-opening, via which the first skid lies against the underside of the rectangular base frame in a fluidically sealing manner.

4. The switch cabinet frame rack according to claim 1, wherein the first skid has a fastening element, the fastening element engages in the rectangular base frame via the at least one first through-opening and is fixed in the at least one first through-opening.

5. The switch cabinet frame rack according to claim 4, wherein the fastening element is integrally formed on the first skid via a predetermined breaking point.

6. The switch cabinet frame rack according to claim 1, wherein the at least one first through-opening in at least one of four corners of the rectangular base frame is closed by the first skid.

7. The switch cabinet frame rack according to claim 1, wherein a packaging of the switch cabinet frame rack is arranged between the first skid and the underside of the rectangular base frame, wherein the first skid has a fastening element that extends through the packaging into the at least one first through-opening of the rectangular base frame.

8. The switch cabinet frame rack according claim 7, wherein a fitting piece is formed on the fastening element, with the first skid engages in a cut-out of the packaging.

9. The switch cabinet frame rack according to claim 8, wherein the first skid has a support flange formed on an outer circumference of the first skid and on the fitting piece, the support flange is spaced apart from the underside of the rectangular base frame by a thickness of the packaging.

10. The switch cabinet frame rack according claim 8, wherein the first skid engages in the cut-out of the packaging in a positive-fitting manner.

11. The switch cabinet frame rack according to claim 7, wherein the packaging is a cardboard box.

12. The switch cabinet frame rack according to claim 1, wherein the first skid has a threaded passage extending perpendicularly to the underside of the rectangular base frame into which a levelling bolt accessible from an upper side of the rectangular base frame is screwed, the upper side opposite the underside.

13. The switch cabinet frame rack according to claim 12, wherein a threaded passage is an injected threaded nut.

14. The switch cabinet frame rack according to claim 1, wherein the first skid has a first bolt passage fluidically closed by a predetermined breaking point.

15. The switch cabinet frame rack according to claim 14, wherein the switch cabinet frame rack is placed with the rectangular base frame on the switch cabinet base, wherein the first bolt passage is fluidically closed via a predetermined breaking point, the first bolt passage is aligned with a second bolt passage of a base corner piece of the switch cabinet base and with a third bolt passage of the rectangular base frame, and wherein either the second bolt passage or the third bolt passage has an internal thread.

16. The switch cabinet frame rack according to claim 1, wherein the switch cabinet base has a base corner piece in each of four corners of the switch cabinet base, the base corner piece has at least one second through-opening through a base side of the base corner piece facing away from the rectangular base frame, the at least one second through-opening is closed by a second skid which is detachably mounted on the base side from the outer side of the base corner piece.

17. The switch cabinet frame rack according to claim 1, wherein the switch cabinet frame rack is placed on a switch cabinet base, a shaped base corner piece at each of four corners of the switch cabinet base, the shaped base corner piece having a first outer wall and a second outer wall which extend perpendicular to each other, and an upper cover side and a lower base side which are arranged parallel to each other and perpendicular to the first and second outer walls, wherein the first and second outer walls, the upper cover side and the lower base side delimit an interior space of the base corner piece which is open towards a corner of the shaped base corner piece.

18. The switch cabinet frame rack according to claim 17, wherein the shaped base corner piece is a sheet metal shaped base corner piece.

19. The switch cabinet frame rack according to claim 1, wherein the first skid has two lever pockets on an outer circumference of the first skid, each of the two lever pockets is open to the outer circumference of the first skid and to the underside of the rectangular base frame.

20. The switch cabinet frame rack according to claim 1, wherein the rectangular base frame comprises a base corner piece, the base corner piece has the recess.

* * * * *